United States Patent
Qiao et al.

(10) Patent No.: US 8,344,765 B2
(45) Date of Patent: Jan. 1, 2013

(54) FREQUENCY DIVIDER WITH A CONFIGURABLE DIVIDING RATIO

(75) Inventors: Dongjiang Qiao, San Diego, CA (US); Frederic Bossu, San Diego, CA (US)

(73) Assignee: QUALCOMM, Incorporated, San Diego, CA (US)

(*) Notice: Subject to any disclaimer, the term of this patent is extended or adjusted under 35 U.S.C. 154(b) by 148 days.

(21) Appl. No.: 12/836,454

(22) Filed: Jul. 14, 2010

(65) Prior Publication Data

US 2011/0012647 A1   Jan. 20, 2011

Related U.S. Application Data

(60) Provisional application No. 61/226,226, filed on Jul. 16, 2009.

(51) Int. Cl.
  H03B 19/06   (2006.01)
  H03K 21/00   (2006.01)
(52) U.S. Cl. ............ 327/118; 327/115; 327/117; 377/47
(58) Field of Classification Search .......... 327/113–115, 327/117, 118; 377/47, 48; 331/57
  See application file for complete search history.

(56) References Cited

U.S. PATENT DOCUMENTS

| | | | | |
|---|---|---|---|---|
| 3,749,937 A | * | 7/1973 | Rogers | 377/108 |
| 4,063,114 A | * | 12/1977 | Morozumi | 377/106 |
| 4,951,303 A | * | 8/1990 | Larson | 377/110 |
| 4,953,187 A | * | 8/1990 | Herold et al. | 377/48 |
| 6,097,783 A | * | 8/2000 | Monk | 377/47 |
| 6,208,179 B1 | * | 3/2001 | Monk | 327/117 |
| 6,297,681 B1 | * | 10/2001 | Wang | 327/281 |
| 7,825,703 B2 | * | 11/2010 | Qiao et al. | 327/117 |
| 2006/0087350 A1 | * | 4/2006 | Ruffieux | 327/117 |
| 2010/0240323 A1 | * | 9/2010 | Qiao et al. | 455/75 |

FOREIGN PATENT DOCUMENTS

| | | |
|---|---|---|
| EP | 0601780 | 6/1994 |
| FR | 2852749 | 9/2004 |
| WO | WO9839845 | 9/1998 |

OTHER PUBLICATIONS

International Search Report and Written Opinion—PCT/US2010/042191, International Search Authority—European Patent Office—Oct. 8, 2010.

* cited by examiner

*Primary Examiner* — Patrick O'Neill
(74) *Attorney, Agent, or Firm* — William M. Hooks

(57) ABSTRACT

A method for dividing the frequency of a signal using a configurable dividing ratio is disclosed. An input signal with a first frequency is received at clocked switches in a frequency divider with a configurable dividing ratio. Non-clocked switches inside the frequency divider are operated to select one of multiple dividing ratios. An output signal is output with a second frequency that is the first frequency divided by the selected dividing ratio.

32 Claims, 13 Drawing Sheets

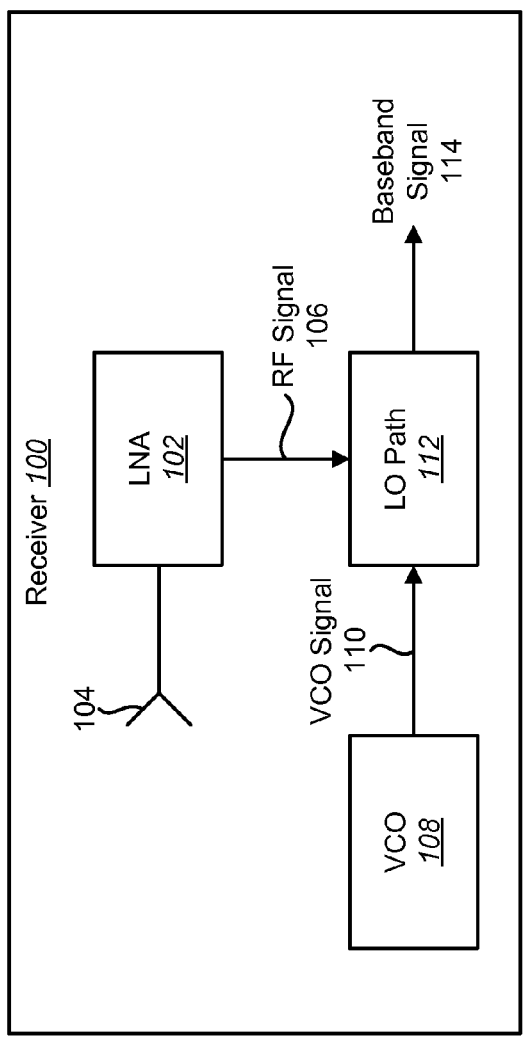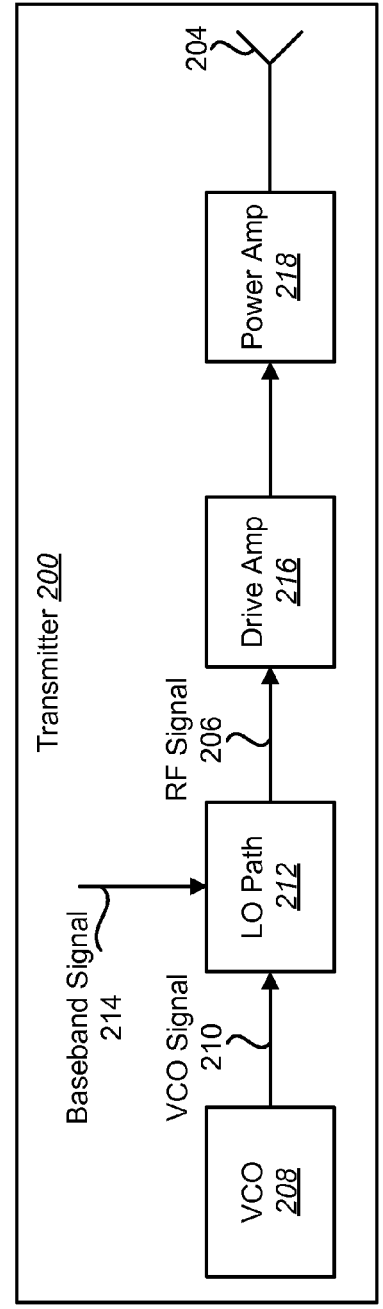

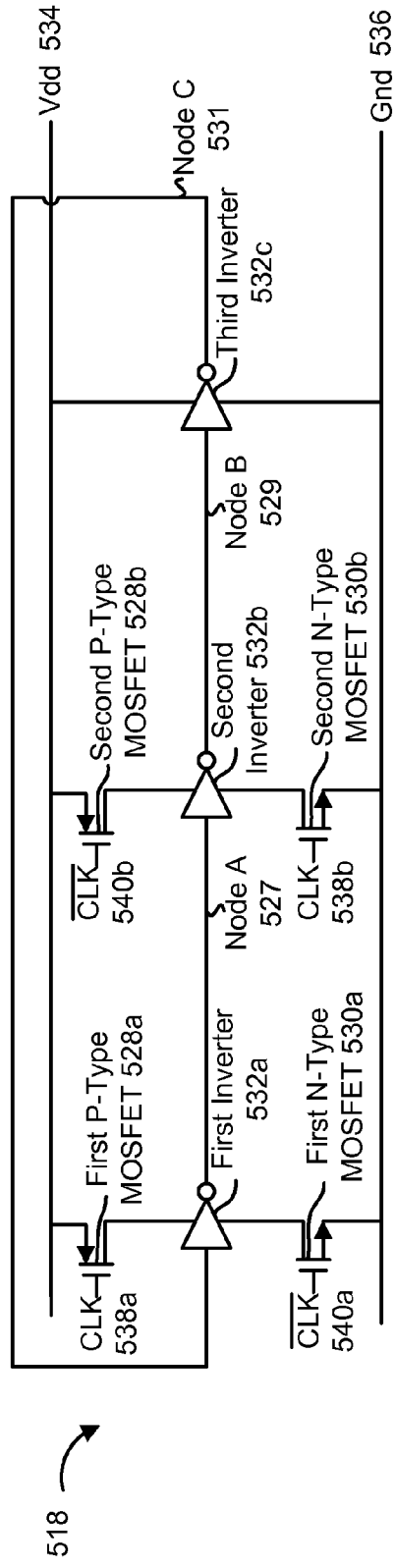
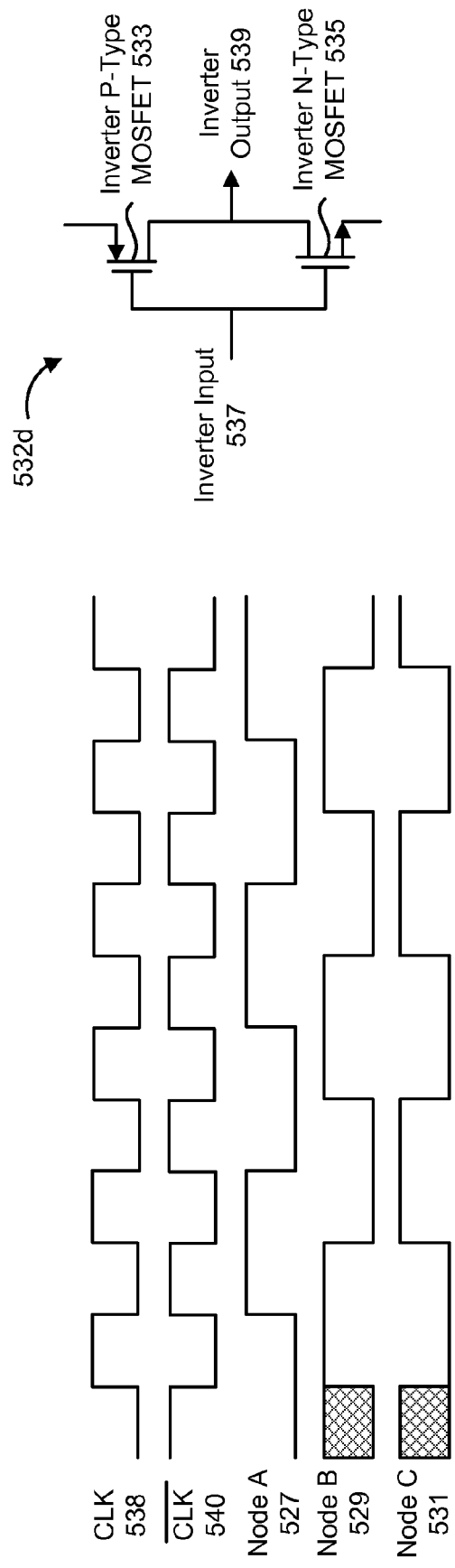
FIG. 5A
FIG. 5B
FIG. 5C

FREQUENCY DIVIDER WITH A CONFIGURABLE DIVIDING RATIO

RELATED APPLICATIONS

This application is related to and claims priority from U.S. Provisional Patent Application Ser. No. 61/226,226 filed Jul. 16, 2009, for "A Frequency Divider with Reconfigurable Dividing Ratios."

TECHNICAL FIELD

The present disclosure relates generally to communication systems. More specifically, the present disclosure relates to a frequency divider with a configurable dividing ratio.

BACKGROUND

Wireless communication systems have become an important means by which many people worldwide have come to communicate. A wireless communication system may provide communication for a number of mobile devices, each of which may be serviced by a base station. Examples of mobile devices include cellular phones, personal digital assistants (PDAs), handheld devices, wireless modems, laptop computers, personal computers, etc.

Mobile devices may include a variety of digital circuits used during operation. For example, an oscillator may be used to synchronize various circuits across a board or integrated circuit within a mobile device. Furthermore, different circuits within a mobile device may operate using different frequencies. Therefore, mobile devices may use multiple oscillators for different purposes.

However, like other portable electronic devices, mobile devices may have limited battery life. Along with other types of circuits, oscillators consume current during operation, thus shortening battery life. Furthermore, it may be desirable to minimize the amount of area used by circuit components on an integrated circuit. Therefore, benefits may be realized by a frequency divider with a configurable dividing ratio.

SUMMARY

A method for dividing the frequency of a signal using a configurable dividing ratio is disclosed. An input signal with a first frequency is received at clocked switches in a frequency divider with a configurable dividing ratio. Non-clocked switches inside the frequency divider are operated to select one of multiple dividing ratios. An output signal is output with a second frequency that is the first frequency divided by the selected dividing ratio.

In one configuration, the input signal may be an output signal of a voltage controlled oscillator and the switches may be metal-oxide-semiconductor field effect transistors (MOSFETs). Furthermore, the switches may be p-type MOSFETs that couple inverters to a direct current (DC) reference voltage and n-type MOSFETs that couple the inverters to ground. At least two of the inverters may each be coupled to a clocked p-type MOSFET in parallel with a non-clocked p-type MOSFET and a clocked n-type MOSFET in parallel with a non-clocked n-type MOSFET. The clocked MOSFETs may receive the input signal or an inverted version of the input signal, the non-clocked p-type MOSFETs may receive a control signal and the non-clocked n-type MOSFETs may receive an inverted version of the control signal.

In another configuration, the output signal may be mixed with a radio frequency signal to produce a baseband signal. Alternatively, the output signal may be mixed with a baseband signal to produce a radio frequency signal.

A frequency divider with a configurable dividing ratio is also disclosed. The frequency divider includes multiple clocked switches configured to receive an input signal with a first frequency. The frequency divider also includes multiple non-clocked switches configured to select one of multiple dividing ratios. The apparatus also includes multiple inverters configured to output an output signal with a second frequency that is the first frequency divided by the selected dividing ratio.

A frequency divider with a configurable dividing ratio is also disclosed. The frequency divider includes means for receiving an input signal with a first frequency at clocked switches in a frequency divider with a configurable dividing ratio. The frequency divider also includes means for operating non-clocked switches inside the frequency divider to select one of multiple dividing ratios. The frequency divider also includes means for outputting an output signal with a second frequency that is the first frequency divided by the selected dividing ratio.

An integrated circuit for dividing the frequency of a signal using a configurable dividing ratio is also disclosed. The integrated circuit is configured to receive an input signal at clocked switches in a frequency divider with a configurable dividing ratio. The integrated circuit is also configured to operate non-clocked switches inside the frequency divider to select one of multiple dividing ratios. The integrated circuit is also configured to output an output signal with a second frequency that is the first frequency divided by the selected dividing ratio.

BRIEF DESCRIPTION OF THE DRAWINGS

FIG. 1 is a block diagram illustrating a receiver with a local oscillator (LO) path that may use a frequency divider with a configurable dividing ratio;

FIG. 2 is a block diagram illustrating a transmitter with an LO path that may use a frequency divider with a configurable dividing ratio;

FIG. 5A is a circuit diagram illustrating a divide-by-2 frequency divider;

FIG. 5B is a timing diagram that illustrates the signal at various nodes in the frequency divider of FIG. 5A;

FIG. 5C is a circuit diagram illustrating one configuration of an inverter;

DETAILED DESCRIPTION

Figure 3:
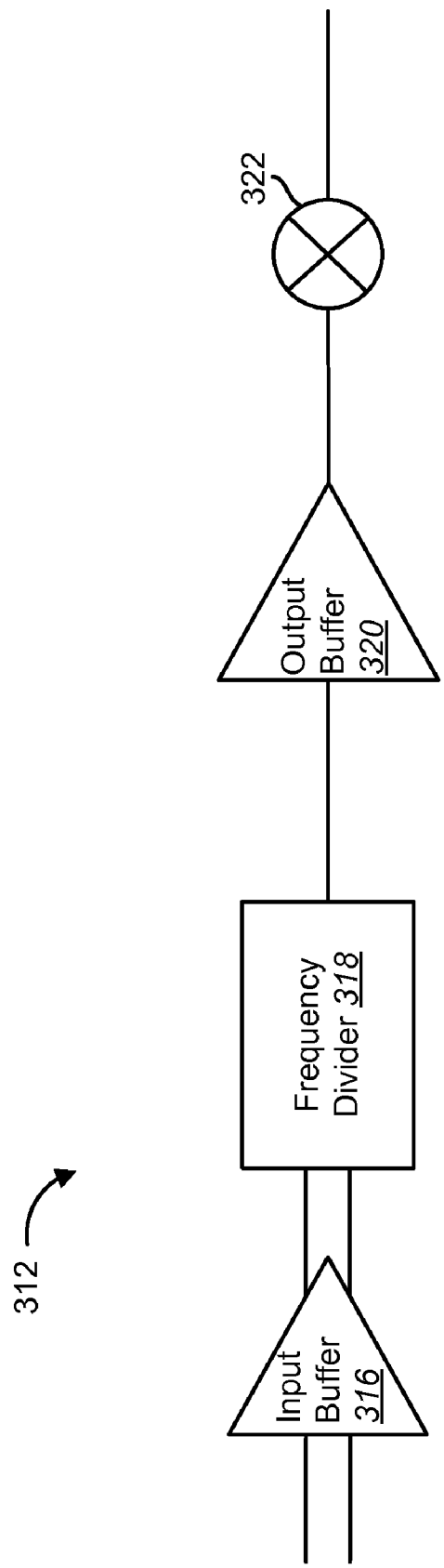
FIG. 3 is a block diagram illustrating an LO path.

A local oscillator (LO) may be used in mobile devices to convert a particular signal to a different frequency. For example, a high frequency signal may be converted to a lower, baseband signal or vice versa. In addition to an oscillator, such as a voltage controlled oscillator (VCO), an LO may include an LO path that may include one or more buffers, frequency dividers and mixers. The LO path may process the output of the oscillator to achieve a desired output.

A frequency divider may receive a VCO signal as input and output a signal with a frequency divided by a dividing ratio. For example, a divide-by-2 frequency divider may output a signal with ½ the frequency of an input VCO signal. Similarly, a divide-by-4 frequency divider may output a signal with ¼ the frequency of an input VCO signal.

It may be desirable to have different available dividing ratios for several reasons. First, radio frequency (RF) chips in mobile devices may be used at different frequency bands. In order to reduce the tuning range of VCO, different dividing ratios may be used to generate signal for different frequency bands. Second, mobile devices may use more than one receiver at the same time. This kind of system may have multiple VCOs. If the VCOs operate at frequencies close to each other, there may be a pulling effect, i.e., VCOs will impact the frequency accuracy of each other. If frequency dividers with different dividing ratios are used, the VCOs may operate at frequencies which are far away to each other and the pulling effect may be avoided.

One possible way to achieve different dividing ratios may be to use a combination of different frequency dividers in an LO path. For example, in order to achieve dividing ratios of two and 4, a divide-by-2 frequency divider and a divide-by-4 frequency divider may be placed in parallel and controlled by switches. Alternatively, two divide-by-two frequency dividers may be connected in series and one of them may be bypassed using switches. However, two frequency dividers and associated control switches may use a relatively large area on an integrated circuit and have relatively high current consumption. Therefore, the present systems and methods use a frequency divider with a configurable dividing ratio.

FIG. 1 is a block diagram illustrating a receiver 100 with a local oscillator (LO) path 112 that may use a frequency divider with a configurable dividing ratio. The receiver 100 may be part of a mobile device or base station designed for wireless communication. The receiver 100 may include, among other things, a low noise amplifier (LNA) 102, a VCO 108 and an LO path 112. The LNA 102 may receive a wireless communication signal from an antenna 104. The LNA 102 may amplify the received signal to usable levels and produce a radio frequency (RF) signal 106, i.e., a representation of the original signal sent. The VCO 108 may be a device that outputs a VCO signal 110 with a frequency based on a direct current (DC) voltage level at the VCO 108 input. The LO path 112 may receive the RF signal 106 from the LNA 102 and the VCO signal 110 from the VCO 108 and use some combination of buffers, frequency dividers, mixers and summers to produce a baseband signal 114. The baseband signal 114 may be the actual reconstructed audio received by a microphone on a transmitting device, e.g., voiced speech or other kinds of data. Thus, the receiver 100 may use the LO path 112 to reconstruct the baseband signal 114.

FIG. 2 is a block diagram illustrating a transmitter 200 with an LO path 212 that may use a frequency divider with a configurable dividing ratio. The transmitter 200 may be part of a mobile device that may also include the receiver 100 illustrated in FIG. 1. The transmitter 200 may include, among other things, a VCO 208, an LO path 212, a drive amplifier 216 and a power amplifier 218. The LO path 212 may receive a VCO signal 210 and a baseband signal 214 (e.g., voiced speech), and use a combination of buffers, frequency dividers, mixers and summers to produce an RF signal 206. In other words, the transmitter 200 may use the LO path 212 to produce a modulated, high frequency RF signal 206 to be transmitted. Before the RF signal 206 is transmitted via an antenna 204, it may be amplified by a drive amplifier 216, a power amplifier 218 or both. Thus, the transmitter 200 may use the LO path 212 to construct an RF signal 206 for transmission.

FIG. 3 is a block diagram illustrating an LO path 312. The LO path 312 may be used with the present systems and methods to reduce average current consumption, minimize area on an integrated circuit, or both. As used herein, the term "LO path" refers to the combination of at least a frequency divider 318 and a mixer 322. The LO path 312 may also include an input buffer 316 and an output buffer 320. Among other functions, LO paths 312 may be used in a receiver 100 or a transmitter 200 to produce a baseband signal 114 or an RF signal 206 at a particular amplitude and phase, respectively. In one configuration, the LO path 312 may include a single input buffer 316, a single frequency divider 318, a single output buffer 320, and a single mixer 322.

Mobile devices may be designed to work at several different frequency bands. When the LO path 312 is operating, depending on the frequency band the mobile device is using, the frequency divider 318 may have a configurable dividing ratio, i.e., one of multiple dividing ratios may be selected for the frequency divider 318. In one configuration, selecting a dividing ratio may include using a control signal to configure a series of transistors in the frequency divider 318.

Figure 4:
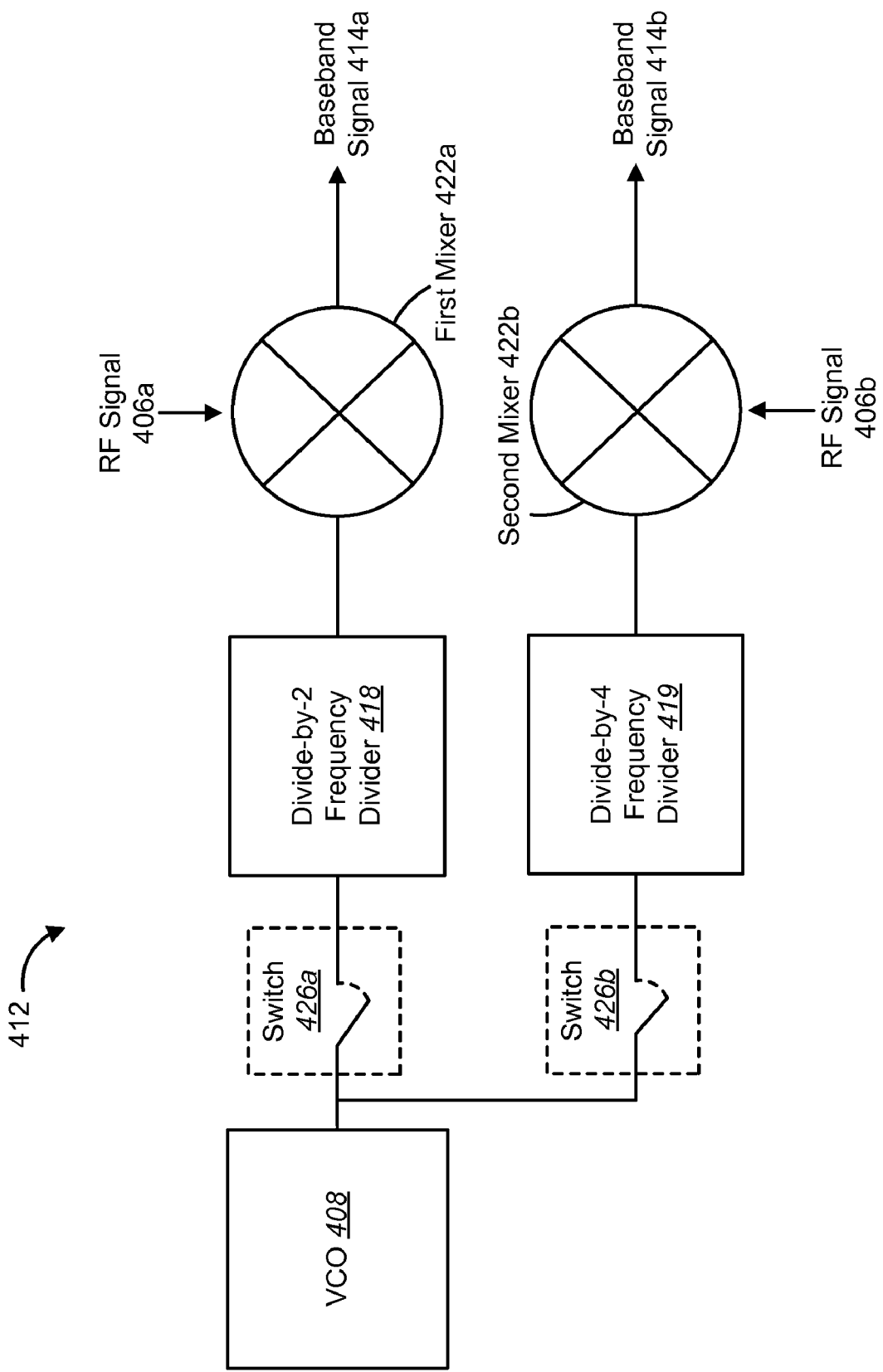
FIG. 4 is a block diagram illustrating an LO path that includes two frequency dividers and mixers.

FIG. 4 is a block diagram illustrating an LO path 412 that includes two frequency dividers 418, 419 and mixers 422*a-b*. The frequency dividers 418, 419 and the mixers 422*a-b* may be independent. In one configuration, the LO path 412 may include a divide-by-2 frequency divider 418 and a divide-by-4 frequency divider 419 that are not configurable. One or more switches 426*a-b* may direct the output of the VCO 408 to either the divide-by-2 frequency divider 418 or the divide-by-4 frequency divider 419 based on the desired dividing ratio. If the first switch 426*a* is closed, the divide-by-2 frequency divider 418 may output a signal with a frequency that is ½ the VCO 408 signal to a first mixer 422*a*. In a receiver configuration the first mixer 422 may mix the output of divide-by-2 frequency divider 418 with an RF signal 406*a* to produce a baseband signal 414*a*. Alternatively, if the second switch 426*b* is closed, the divide-by-4 frequency divider 419 may output a signal with a frequency that is ¼ the VCO 408 signal and is mixed by a second mixer 422*b* with the RF signal 406*b* to produce a baseband signal 414*b*.

While the LO path 412 may be able to select either a dividing ratio of two or four, it may also use a relatively large area on an integrated circuit because it uses two independent frequency dividers 418, 419. Furthermore, this configuration may have a large input capacitance, which may act as a relatively large load to a VCO output buffer (not shown).

FIG. 5A is a circuit diagram illustrating a divide-by-2 frequency divider 518. The frequency divider 518 may include two branches, each with two switches and an inverter 532*a-b*. For example, each branch may include a p-type metal-oxide-semiconductor (PMOS) field effect transistor 528*a-b* that couples the inverters 532*a-b* to a direct current (DC) voltage (Vdd) 534 and an n-type metal-oxide-semiconductor (NMOS) field effect transistor 530a-b that couples the inverters 532a-b to ground 536.

The transistors 528a-b, 530a-b may receive a clock signal 538a-b or an inverted clock signal 540a-b at their respective gates, e.g., the clock signal 538a-b may be the output of a VCO. In one configuration, the first p-type MOSFET 528a may receive the clock signal 538a, while the second p-type MOSFET 528b may receive the inverted clock signal 540b at their respective gates. Conversely, the first n-type MOSFET 530a may receive the inverted clock signal 540a and the second n-type MOSFET may receive the clock signal 538b at their respective gates. Furthermore, a third branch may include an inverter 532c that is coupled to Vdd 534 and ground 536 directly, i.e., without any transistors. The output of the third inverter 532c may be fed back to the first inverter 532a. When in steady state, the output of the third inverter 532c may be a digital signal with a frequency of ½ the clock signal 538a-b.

FIG. 5B is a timing diagram that illustrates the signal at various nodes in the frequency divider 518 of FIG. 5A. In other words, FIG. 5B illustrates how frequency division is achieved in the divide-by-2 frequency divider 518. The timing diagram assumes that the initial state of the third inverter is zero. The state of node A 527 may be set to high (i.e., Vdd 534) when both the clock signal 538 and node C 531 are low (i.e., ground 536), and to low when both the inverted clock signal 540 and node C 531 are high. In other cases, the state of node A 527 may remain unchanged. The state of node B 529 may be set to high (i.e., Vdd 534) when both the inverted clock signal 540 and node A 527 are low (i.e., ground 536), and to low when both the clock signal 538 and node A 527 are high. In other cases, the state of node B 529 may remain unchanged. Therefore, the waveform at any node A 527, node B 529 and node C 531 may have ½ of the frequency of the clock signal 538.

FIG. 5C is a circuit diagram illustrating one configuration of an inverter 532d. In one configuration, each inverter 532d may be implemented using an inverter p-type MOSFET in series with an inverter n-type MOSFET 535 that each receive the inverter input 537 at their gates and output the inverter output 539 at their drains. In other words, the inverter output 539 may be taken from the drains of the inverter p-type MOSFET 533 and the inverter n-type MOSFET 535 that are coupled together. The sources of the inverter MOSFETs 533, 535 may be coupled to Vdd 534 or ground 536, e.g., via one or more MOSFETs 528a-b, 530a-b.

Figure 6:
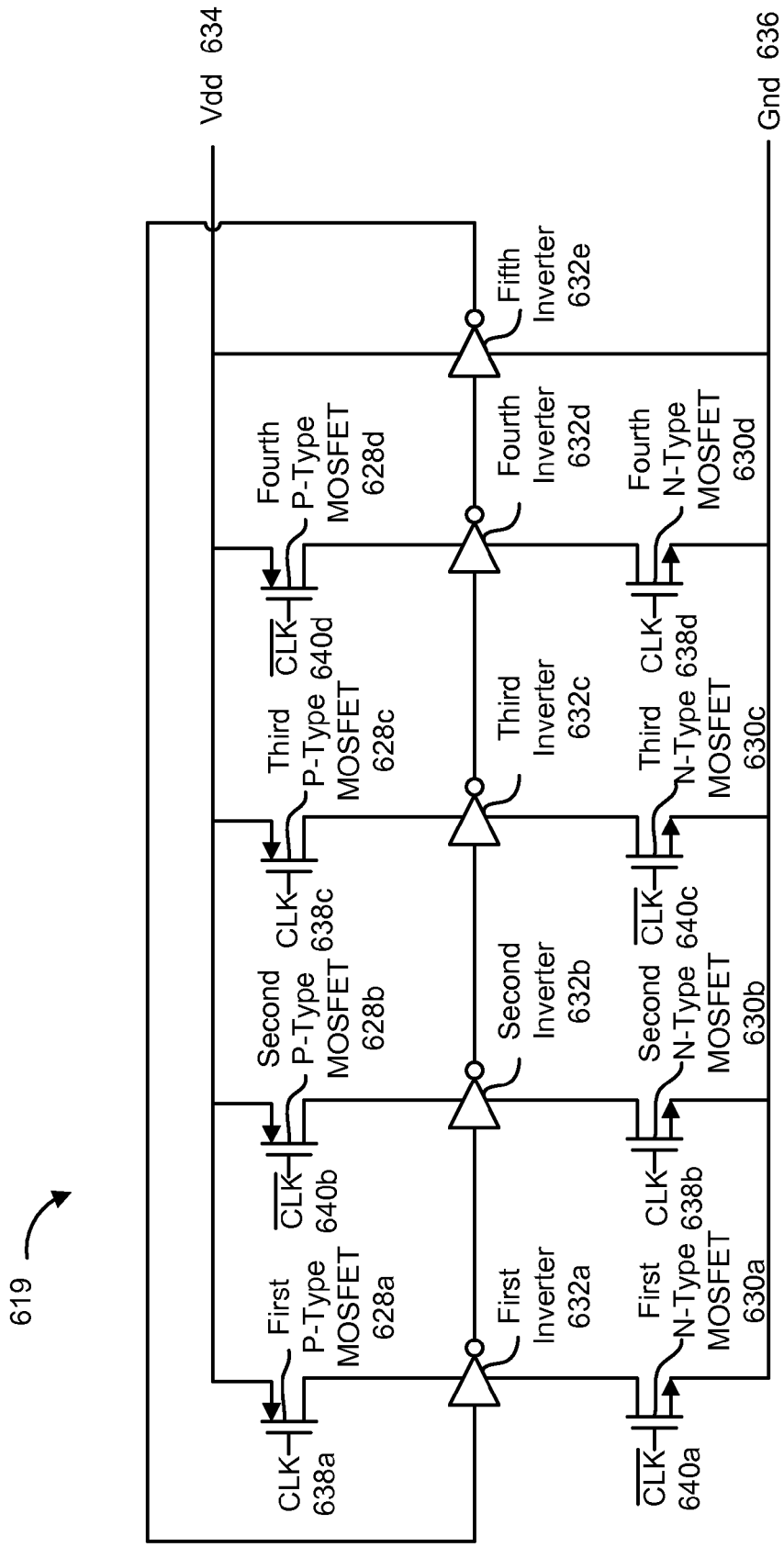
FIG. 6 is a circuit diagram illustrating a divide-by-4 frequency divider.

FIG. 6 is a circuit diagram illustrating a divide-by-4 frequency divider 619. In contrast to the divide-by-2 frequency divider 518 illustrated in FIG. 5, the divide-by-4 frequency divider 619 may include four branches, each with two switches and an inverter 632a-d. Like before, each branch may include a p-type metal-oxide-semiconductor (PMOS) field effect transistor 628a-d that couples the inverters 632a-d to a DC voltage (Vdd) 634 and an n-type metal-oxide-semiconductor (NMOS) field effect transistor 630a-d that couples the inverters 632a-d to ground 636. The transistors 628a-d, 630a-d may receive a clock signal 638a-d or an inverted clock signal 640a-d at their respective gates, e.g., the clock signal 638a-d may be the output of a VCO. In one configuration, the first p-type MOSFET 628a may receive the clock signal 638a, the second p-type MOSFET 628b may receive the inverted clock signal 640b, the third p-type MOSFET 628c may receive the clock signal 638c and the fourth p-type MOSFET 628d may receive the inverted clock signal 640d at their respective gates. Conversely, the first n-type MOSFET 630a may receive the inverted clock signal 640a, the second n-type MOSFET 630b may receive the clock signal 638b, the third n-type MOSFET 630c may receive the inverted clock signal 640c and the fourth n-type MOSFET 630d may receive the clock signal 638d at their respective gates. Furthermore, a fifth branch may include an inverter 632e that is coupled to Vdd 634 and ground 636 directly, i.e., without any transistors. The output of the fifth inverter 632e may be fed back to the first inverter 632a. When in steady state, the output of the fifth inverter 632e may be a digital signal with a frequency of ¼ the clock signal 638a-d.

Figure 7:
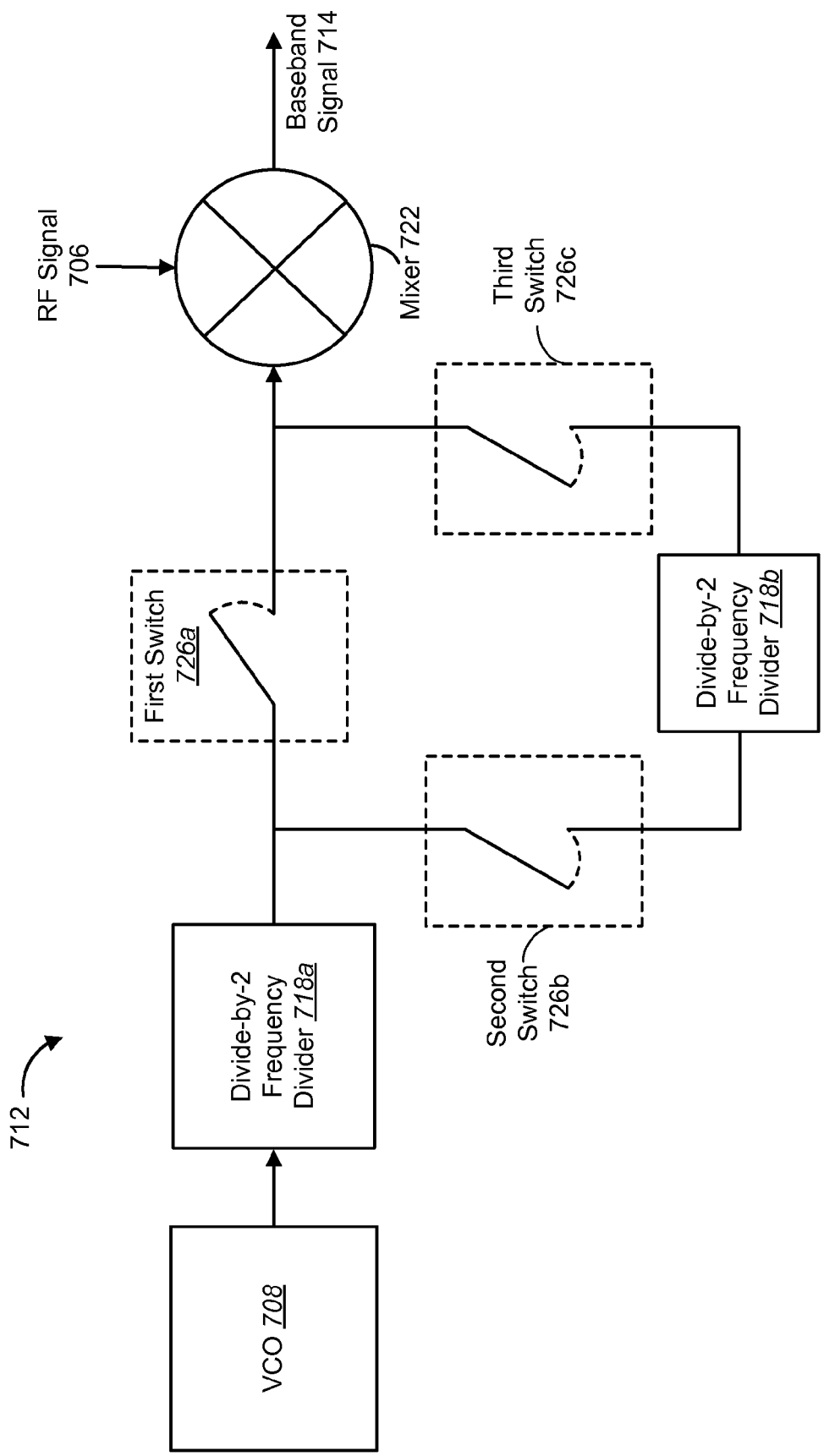
FIG. 7 is a block diagram illustrating an LO path that includes two frequency dividers and a single mixer.

FIG. 7 is a block diagram illustrating an LO path 712 that includes two frequency dividers 718a-b and a single mixer 722. In one configuration, the LO path 712 may include two divide-by-2 frequency dividers 718a-b. In this configuration, the dividing ratio of the entire LO path 712 may be configurable with the use of three switches 726a-c, even though the frequency dividers 718a-b themselves may not have configurable dividing ratios. Specifically, if a dividing ratio of two is desired for the LO path 712, the VCO 708 output may be fed into the first divide-by-2 frequency divider 718a and the output of the first divide-by-2 frequency divider 718a may be directed to the mixer 722, i.e., a first switch 726a may be closed and a second switch 726b and a third switch 726c may be open. Therefore, the input to the mixer 722 may be ½ the frequency of the VCO 708 signal. Alternatively, if a dividing ratio of four is desired for the LO path 712, the output of the first divide-by-2 frequency divider 718a may be directed to a second divide-by-2 frequency divider 718b, i.e., the first switch 726a may be open and the second switch 726b and third switch 726c may be closed to direct the signal through the second divide-by-2 frequency divider 718b. Therefore, the input to the mixer 722 may be ¼ the frequency of the VCO 708 signal.

In a receiver configuration, the mixer 722 may mix an input signal (of ½ or ¼ the frequency of the VCO 708) with an RF signal 706 to produce a baseband signal 714. While the LO path 712 may be able to select either a dividing ratio of two or four, it may consume relatively large amounts of current because the first divide-by-2 frequency divider 718a may operate at a high frequency, i.e., ½ the frequency of the VCO 708 instead of ¼. Furthermore, the switches 726a-c in this configuration may use area on an integrated circuit die.

Figure 8:
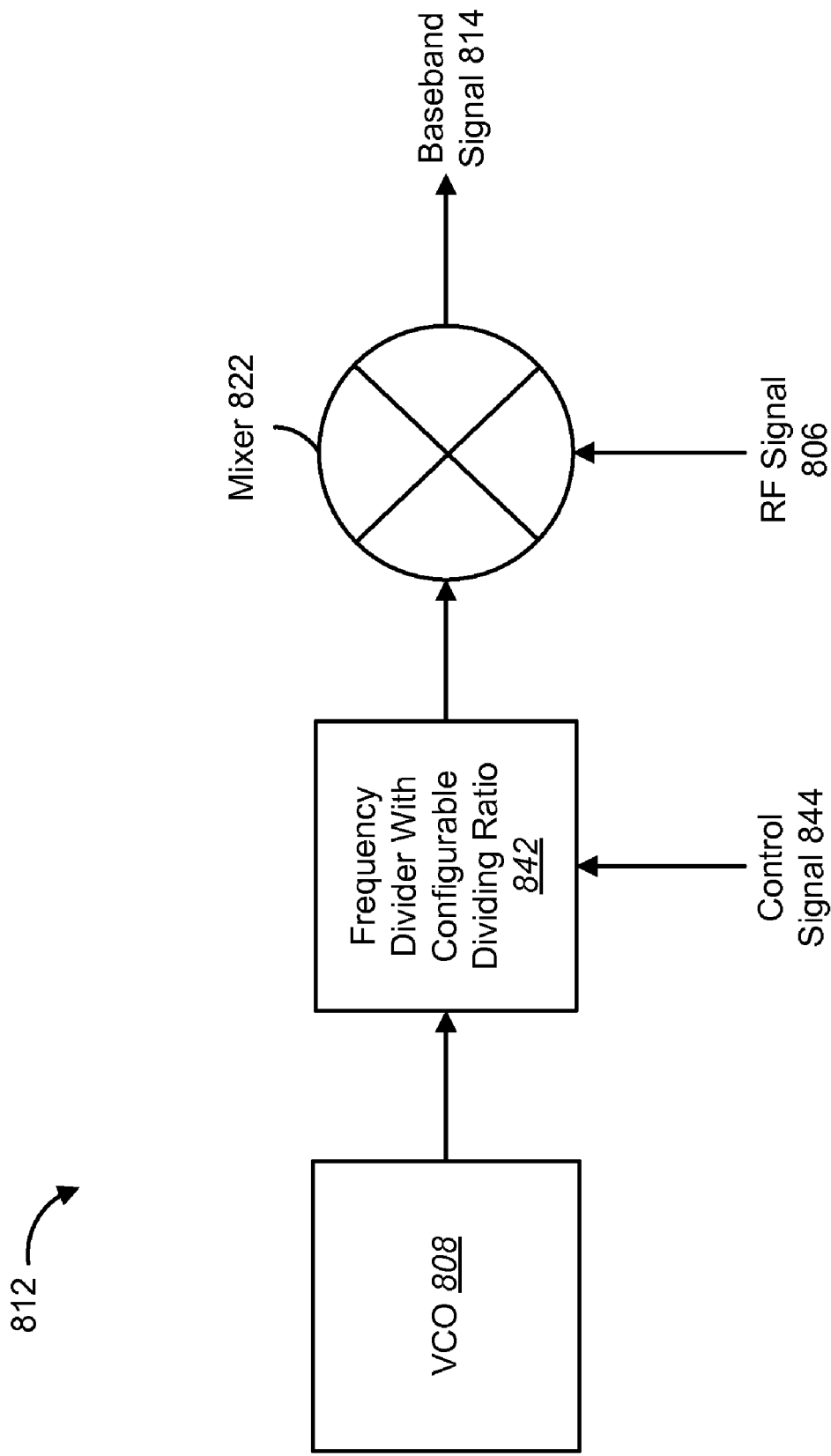
FIG. 8 is a block diagram illustrating an LO path that includes a frequency divider with configurable dividing ratio.

FIG. 8 is a block diagram illustrating an LO path 812 that includes a frequency divider with configurable dividing ratio 842. A control signal 844 may configure the dividing ratio of the frequency divider 842. For example, the frequency divider 842 may divide the frequency of the VCO 808 signal by two or four, depending on the control signal 844. The control signal 844 may open or close switches in the frequency divider 842, e.g., the control signal 844 may be received at gates of field effect transistors. In one configuration, frequency divider 842 may divide the frequency of the VCO 808 signal by four when the control signal 844 is high or by two when the control signal 844 is low. Alternatively, the frequency divider 842 may be configurable with dividing ratios of eight and four, eight and two, sixteen and eight, sixteen and four, sixteen and two, etc. Alternatively, the frequency divider 842 may be configurable with three or more dividing ratios, e.g., 8/4/2, 16/8/4, 16/8/2, 16/4/2, etc. In some configurations with three or more dividing ratios, the frequency divider 842 may receive more than one control signal 844, e.g., two or three.

In a receiver configuration, a mixer 822 may mix an input signal with an RF signal 806 to produce a baseband signal 814. The dividing ratio may be selected based on the control signal 844, i.e., the dividing ratio is configurable. The illustrated frequency divider 842 may use a relatively small area on an integrated circuit because circuit elements for frequency dividers with different dividing ratios may be reused, e.g., transistors and inverters. Furthermore, the illustrated frequency divider 842 may consume relatively small amounts of current because it operates at a low frequency, i.e., ¼ the frequency of the VCO 808 if a dividing ratio of four is selected. In contrast, the cascaded divide-by-2 frequency dividers 718a-b illustrated in FIG. 7 may not both operate at low frequency. Specifically, the first divide-by-2 frequency divider 718a may work at ½ of the VCO 708 frequency and the second divide-by-2 frequency divider 718b may work at ¼ of the VCO frequency. Therefore, the total current consumed by the LO path 712 illustrated in FIG. 7 may be larger than the LO path 812 with the configurable divider-by-4 frequency divider 842 illustrated in FIG. 8.

Figure 9:
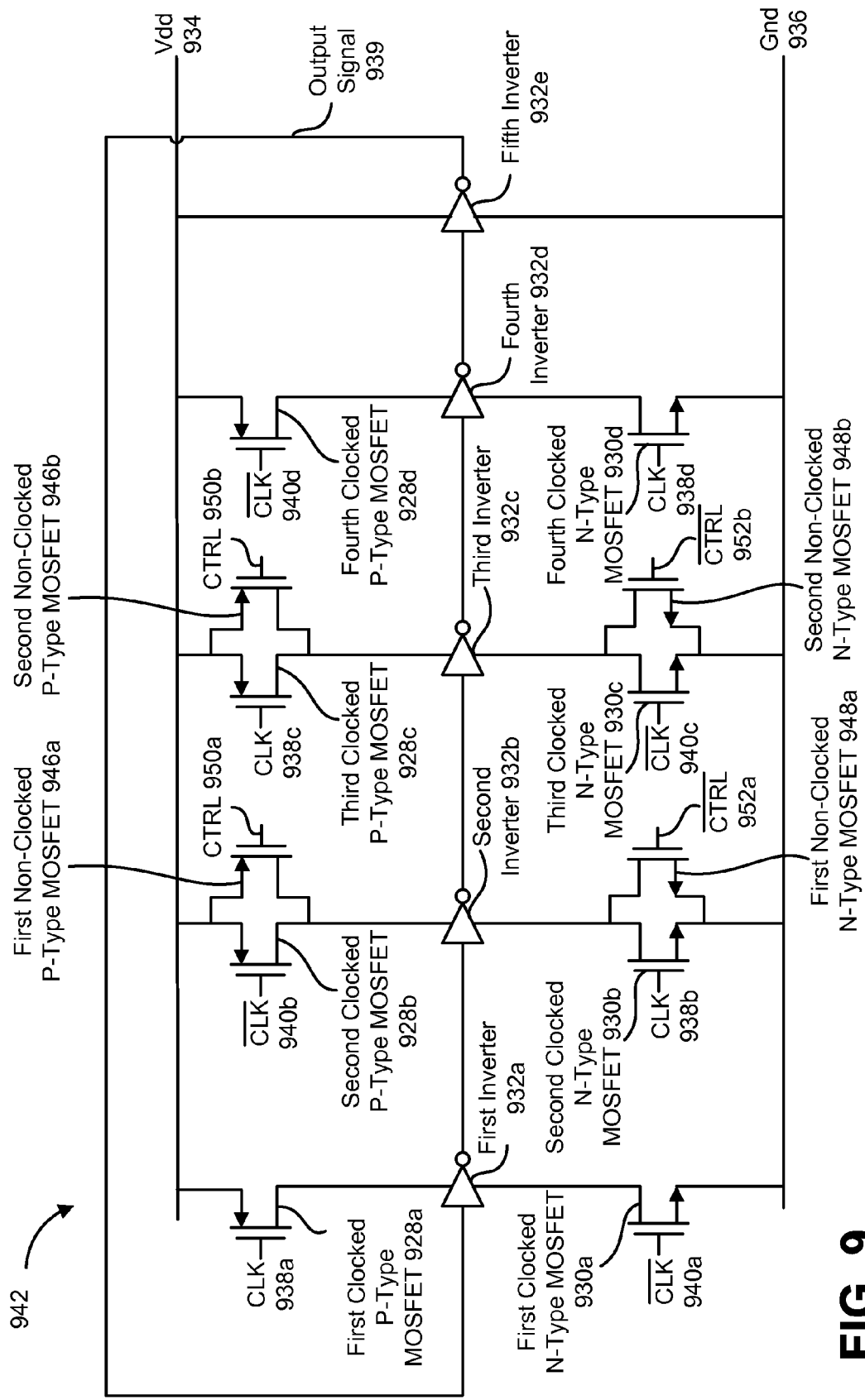
FIG. 9 is a circuit diagram illustrating a frequency divider with configurable dividing ratio.

FIG. 9 is a circuit diagram illustrating a frequency divider with configurable dividing ratio 942. The frequency divider 942 may include four branches, each including a clocked p-type metal-oxide-semiconductor (PMOS) field effect transistor 928a-d that couples the inverter 932a-d to a DC voltage (Vdd) 934 and a clocked n-type metal-oxide-semiconductor (NMOS) field effect transistor 930a-d that couples the inverter 932a-d to ground 936. As used herein, the term "clocked" refers to a circuit element that receives a clock signal, or some variation of it, as input, e.g., a clock signal 938a-d or an inverted clock signal 940a-d. In contrast, the term "non-clocked" refers to a circuit element that does not receive a clock signal at its input. The clocked transistors 928a-d, 930a-d may receive the clock signal 938a-d or the inverted clock signal 940a-d at their respective gates, e.g., the clock signal 938a-d may be the output of a VCO. In one configuration, the first clocked p-type MOSFET 928a may receive the clock signal 938a, the second clocked p-type MOSFET 928b may receive the inverted clock signal 940b, the third clocked p-type MOSFET 928c may receive the clock signal 938c and the fourth clocked p-type MOSFET 928d may receive the inverted clock signal 940d at their respective gates. Conversely, the first clocked n-type MOSFET 930a may receive the inverted clock signal 940a, the second clocked n-type MOSFET 930b may receive the clock signal 938b, the third clocked n-type MOSFET 930c may receive the inverted clock signal 940c and the fourth clocked n-type MOSFET 930d may receive the clock signal 938d at their respective gates.

Additionally, the second and third branches in the frequency divider 942 may each include a non-clocked p-type MOSFET 946a-b in parallel with the clocked p-type MOSFET 928b-c and a non-clocked n-type MOSFET 948a-b in parallel with the clocked n-type MOSFET 930b-c. The non-clocked transistors 946a-b, 948a-b may receive a control signal 950a-b or an inverted control signal 952a-b at their respective gates. Specifically, the non-clocked p-type MOSFETS 946a-b may receive the control signal 950a-b and the non-clocked n-type MOSFETS 948a-b may receive the inverted control signal 952a-b. Therefore, when the control signal 950a-b is high, the non-clocked transistors 946a-b, 948a-b may act as open switches and the frequency divider 942 may be similar to the divide-by-4 frequency divider 619 illustrated in FIG. 6. In contrast, when the control signal 950a-b is low, the non-clocked transistors 946a-b, 948a-b may act as closed switches, thus shorting the clocked transistors 928a-d, 930a-d.

Furthermore, a fifth branch may include an inverter 932e that is coupled to Vdd 934 and ground 936 directly, i.e., without any transistors. The output of the fifth inverter 932e may be fed back to the first inverter 932a. When in steady state, the output of the fifth inverter 932e (i.e., the output signal 939) may be a digital signal with a frequency of ¼ the clock signal 938a-d when the control signal 950a-b is high or ½ the frequency of the clock signal 938a-d when the control signal 950a-b is low.

Figure 10:
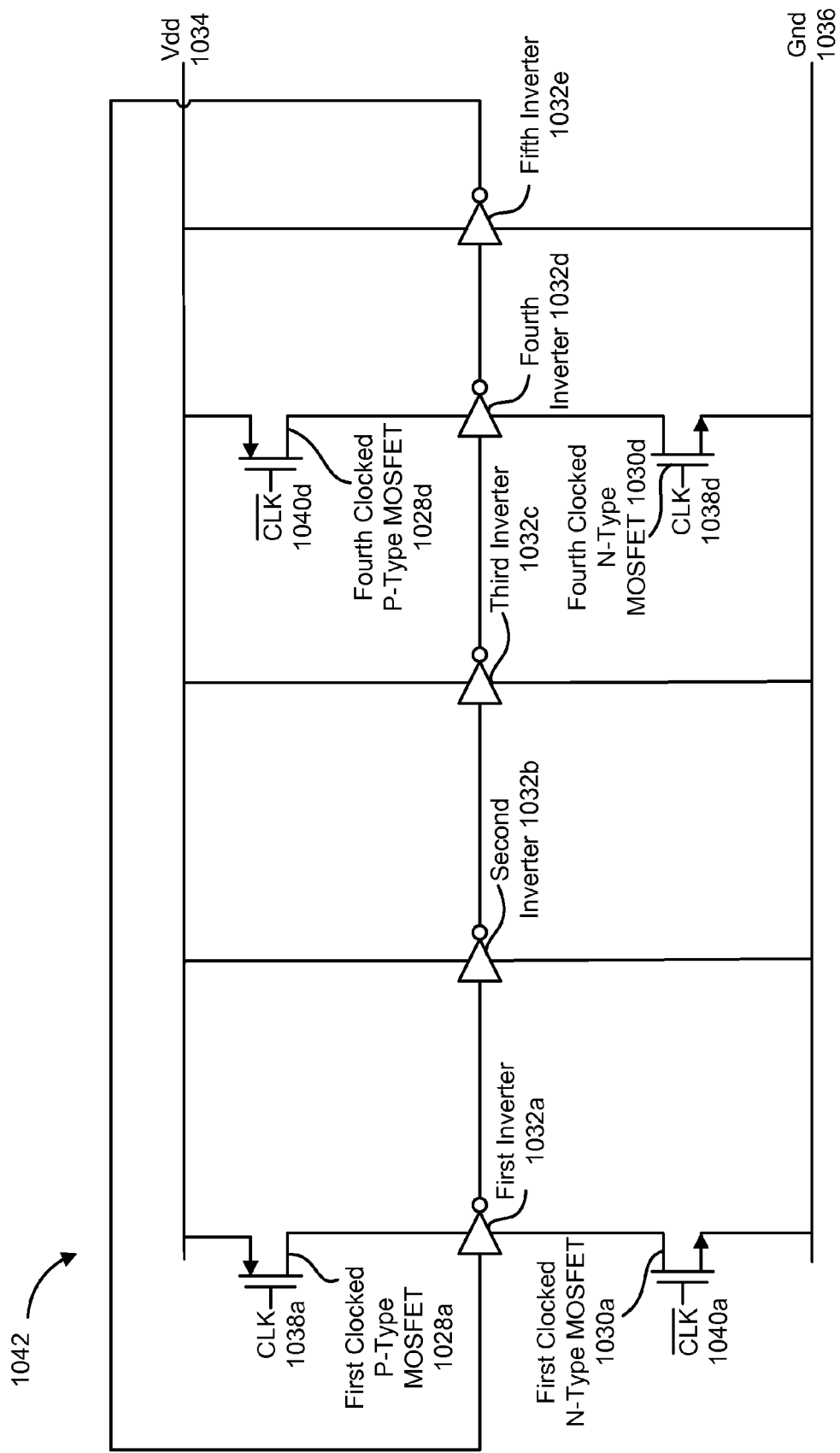
FIG. 10 is a circuit diagram illustrating a frequency divider with configurable dividing ratio when the control signal is low.

FIG. 10 is a circuit diagram illustrating a frequency divider with configurable dividing ratio 1042 when the control signal is low. In other words, the illustrated frequency divider 1042 may be the circuit equivalent of the frequency divider 942 illustrated in FIG. 9 when the control signal 950a-b is low.

As before, the frequency divider 1042 may include multiple branches with inverters 1032a-e. However, when the control signal is low, the transistors coupling the second inverter 1032b and third inverter 1032c to Vdd 1034 and ground 1036 may be shorted, i.e., the second and third clocked p-type MOSFETs 928b-c and the second and third clocked n-type MOSFETS 930b-c are not shown because they may be shorted when the control signal is low. Thus, the second inverter 1032b and the third inverter 1032c may be directly coupled to Vdd 1034 and ground 1036. The first inverter 1032a may be coupled to Vdd 1034 via a first clocked p-type MOSFET 1028a and to ground 1036 via a first clocked n-type MOSFET 1030a. Similarly, the fourth inverter 1032d may be coupled to Vdd 1034 via a fourth clocked p-type MOSFET 1028d and to ground 1036 via a fourth clocked n-type MOSFET 1030d. Like before, the clocked transistors 1028, 1030 may receive a clock signal 1038 or an inverted clock signal 1040.

Furthermore, a fifth branch may include an inverter 1032e that is coupled to Vdd 1034 and ground 1036 directly, i.e., without any transistors. The output of the fifth inverter 1032e may be fed back to the first inverter 1032a. When in steady state (with the control signal low), the output of the fifth inverter 1032e may be a digital signal with a frequency of ½ the clock signal 1038.

Figure 11:
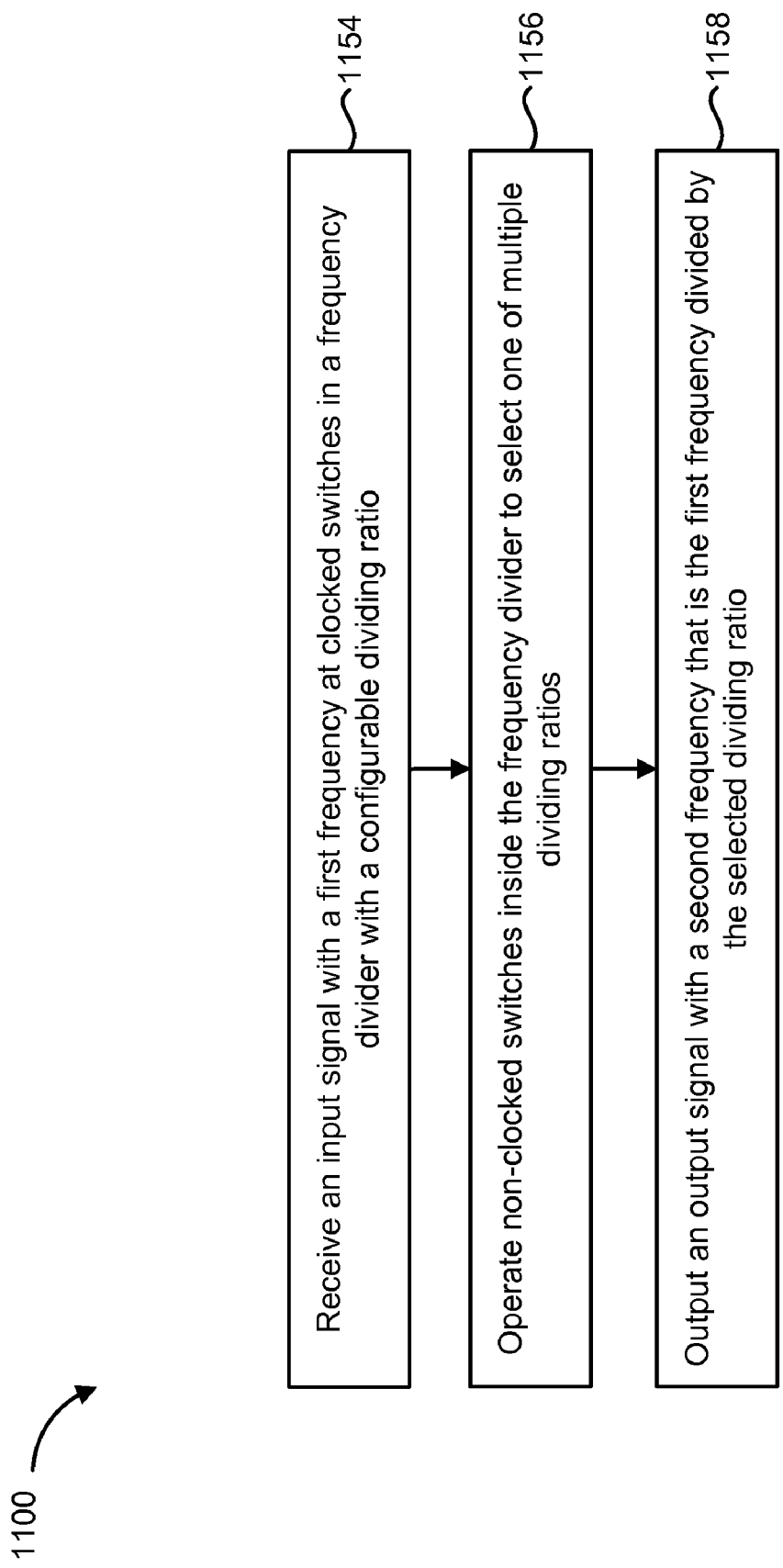
FIG. 11 is a flow diagram illustrating a method for dividing the frequency of a signal using a configurable dividing ratio.

FIG. 11 is a flow diagram illustrating a method 1100 for dividing the frequency of a signal using a configurable dividing ratio. The method 1100 may be performed by a frequency divider with a configurable dividing ratio 942. The frequency divider with a configurable dividing ratio 942 may receive 1154 an input signal with a first frequency, i.e., the input signal may be received 1154 at clocked switches. The input signal may be a VCO signal. The frequency divider with a configurable dividing ratio 942 may also operate 1156 non-clocked switches to select one of multiple dividing ratios. In one configuration, this may include setting a control signal to high or low. The frequency divider 942 may include two, three, four or more possible dividing ratios. Possible dividing ratio combinations may include 4/2, 8/4, 16/8, 8/4/2, 16/8/4, 16/8/2, 16/4/2, etc. In a configuration with three or more possible dividing ratios, selecting a dividing ratio may include setting two or more control signals high or low. The frequency divider with a configurable dividing ratio 942 may also output 1158 an output signal with a second frequency that is the first frequency divided by the selected dividing ratio. In other words, if the first frequency is $F_{VCO}$, the second frequency may be $F_{VCO}/2$, $F_{VCO}/4$, $F_{VCO}/8$, or $F_{VCO}/16$, depending on the control signal(s).

Figure 12:
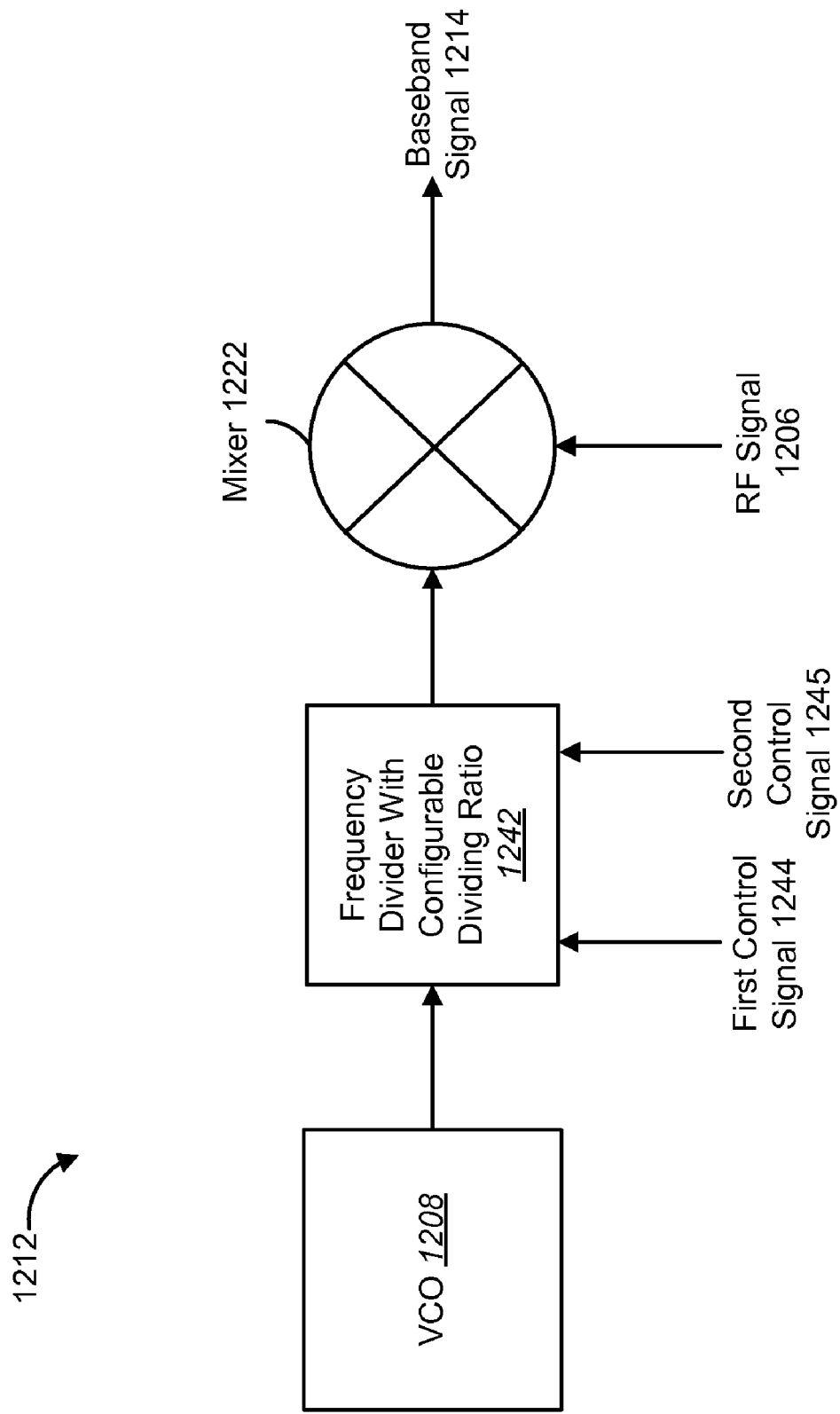
FIG. 12 is a block diagram illustrating an LO path that includes a frequency divider with configurable dividing ratio.

FIG. 12 is a block diagram illustrating an LO path 1212 that includes a frequency divider with configurable dividing ratio 1242. In contrast to the frequency divider 842 illustrated in FIG. 8, however, the frequency divider 1242 may include four possible divide ratios that are selected by a combination of a first control signal 1244 and a second control signal 1245. For example, the frequency divider 1242 may divide the frequency of the VCO 1208 signal by two, four, six or eight, depending on the control signals 1244, 1245. The control signals 1244, 1245 may open or close switches in the frequency divider 1242 to select one of three dividing ratios. In one configuration, the frequency divider 1242 may divide the frequency of the VCO 1208 signal by eight when both control signals 1244, 1245 are high, by six when the first control signal 1244 is low and the second control signal 1245 is high, by four when the first control signal 1244 is high and the second control signal 1245 is low, or by two when both control signals 1244, 1245 are low. Alternatively, the frequency divider 1242 may have three or five possible dividing ratios, e.g., 8/4/2, 16/8/4, 16/8/2, 16/4/2, etc. In a receiver configuration, a mixer 1222 may mix an input signal with an RF signal 1206 to produce a baseband signal 1214.

Figure 13:
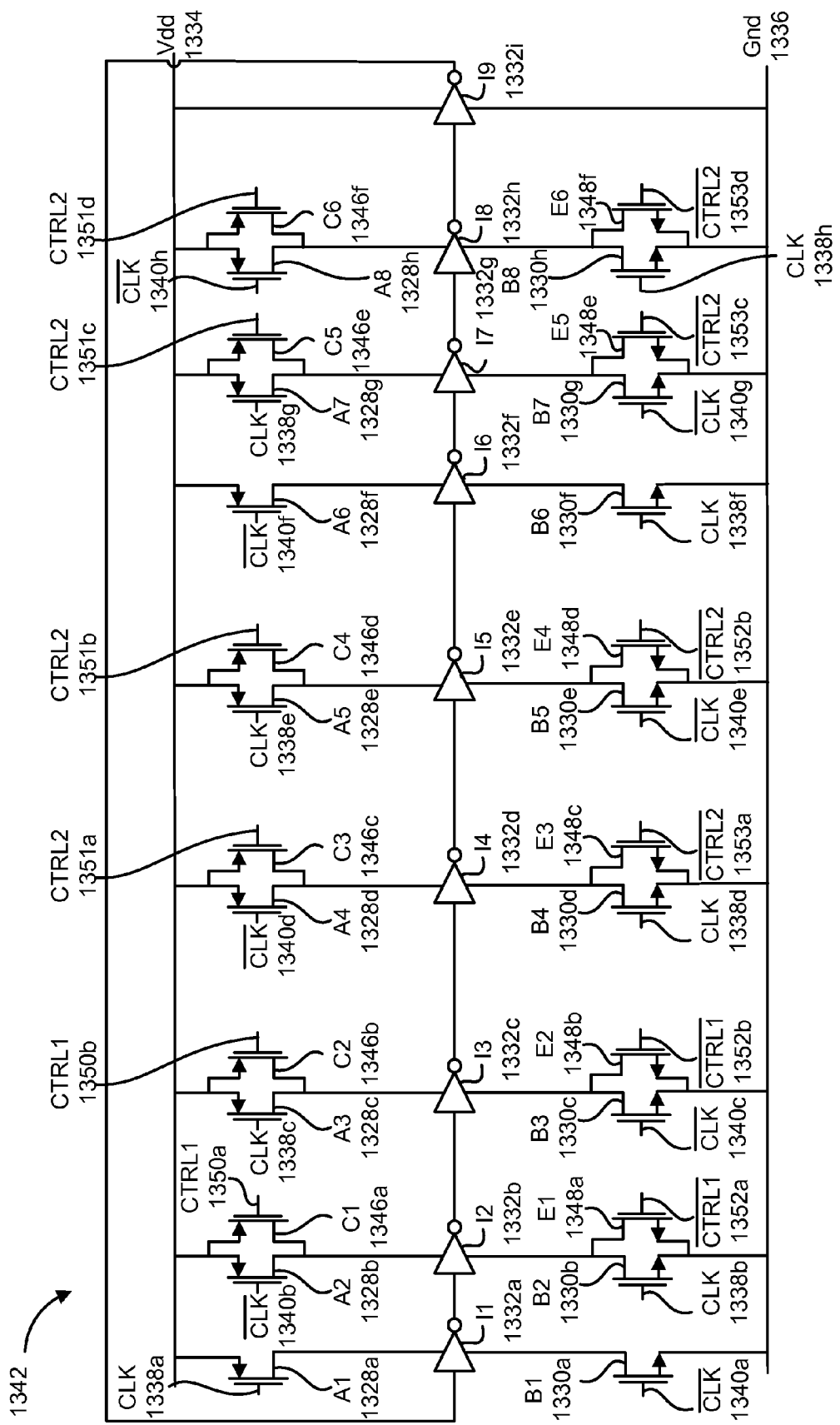
FIG. 13 is a circuit diagram illustrating a frequency divider with configurable dividing ratio that includes four possible dividing ratios.

FIG. 13 is a circuit diagram illustrating a frequency divider with configurable dividing ratio 1342 that includes four possible dividing ratios. Specifically, the frequency divider 1342 may be configured with a dividing ratio of eight, six, four or two, depending on the control signals. The frequency divider 1342 may include eight branches, each including a clocked p-type metal-oxide-semiconductor (PMOS) field effect transistor (A1-A8) 1328*a-h* that couples the inverter (I1-I8) 1332*a-h* to a DC voltage (Vdd) 1334 and a clocked n-type metal-oxide-semiconductor (NMOS) field effect transistor (B1-B8) 1330*a-h* that couples the inverter 1332*a-h* to ground 1336. The clocked transistors 1328*a-h*, 1330*a-h* may receive a clock signal 1338*a-h* or an inverted clock signal 1340*a-h* at their respective gates, e.g., the clock signal 1338*a-h* may be the output of a VCO. In one configuration, the first clocked p-type MOSFET 1328*a* may receive the clock signal 1338*a*, the second clocked p-type MOSFET 1328*b* may receive the inverted clock signal 1340*b*, the third clocked p-type MOSFET 1328*c* may receive the clock signal 1338*c*, the fourth clocked p-type MOSFET 1328*d* may receive the inverted clock signal 1340*d*, etc. Conversely, the first clocked n-type MOSFET 1330*a* may receive the inverted clock signal 1340*a*, the second clocked n-type MOSFET 1330*b* may receive the clock signal 1338*b*, the third clocked n-type MOSFET 1330*c* may receive the inverted clock signal 1340*c*, the fourth clocked n-type MOSFET 1330*d* may receive the clock signal 1338*d*, etc.

Additionally, the second, third, fourth, fifth, seventh and eighth branches in the frequency divider 1342 may each include a non-clocked p-type MOSFET (C1-C6) 1346*a-f* in parallel with a respective clocked p-type MOSFET 1328 and a non-clocked n-type MOSFET (E1-E6) 1348*a-f* in parallel with a respective clocked n-type MOSFET 1330. The non-clocked transistors 1346*a-f*, 1348*a-f* may receive a first control signal (CTRL1) 1350*a-b*, an inverted first control signal ($\overline{\text{CTRL1}}$) 1352*a-b*, a second control signal (CTRL2) 1351*a-d* or an inverted second control signal ($\overline{\text{CTRL2}}$) 1353*a-d* at their respective gates.

Specifically, the first and second non-clocked p-type MOSFETs (C1-C2) 1346*a-b* may receive the first control signal (CTRL1) 1350*a-b* and the first and second non-clocked n-type MOSFETs (E1-E2) 1348*a-b* may receive the inverted first control signal ($\overline{\text{CTRL1}}$) 1352*a-b*. Therefore, when the first control signal (CTRL1) 1350*a-b* is high, the first and second non-clocked transistors 1346*a-b*, 1348*a-b* may act as open switches. In contrast, when the first control signal (CTRL1) 1350*a-b* is low, the first non-clocked transistors 1346*a-b*, 1348*a-b* may act as closed switches.

The third, fourth, fifth and sixth non-clocked p-type MOSFETs (C3-C6) 1346*c-f* may receive the second control signal (CTRL2) 1351*a-d* and the third, fourth, fifth and sixth non-clocked n-type MOSFETs (E3-E6) 1348*c-f* may receive the inverted second control signal ($\overline{\text{CTRL2}}$) 1353*a-d*. Therefore, when the second control signal (CTRL2) 1351*a-d* is high, the third through sixth and second non-clocked transistors 1346*c-f*, 1348*c-f* may act as open switches. In contrast, when the second control signal (CTRL2) 1351*a-d* is low, the third through sixth non-clocked transistors 1346*c-f*, 1348*c-f* may act as closed switches.

Therefore, the frequency divider 1342 may divide the frequency of an input signal by eight when both control signals 1350*a-b*, 1351*a-d* are high, by six when the first control signal 1350*a-b* is low and the second control signal 1351*a-d* is high, by four when the first control signal 1350*a-b* is high and the second control signal 1351*a-d* is low, or by two when both control signals 1350*a-b*, 1351*a-d* are low. Therefore, a dividing ratio of any even number may be obtained using the present systems and methods, e.g., two, four, six, eight, ten, etc.

Furthermore, a ninth branch may include an inverter 1332*i* that is coupled to Vdd 1334 and ground 1336 directly, i.e., without any transistors. The output of the ninth inverter 1332*i* may be fed back to the first inverter 1332*a*. When in steady state, the output of the ninth inverter 1332*i* may be a digital signal with a frequency divided by the selected dividing ratio.

Figure 14:
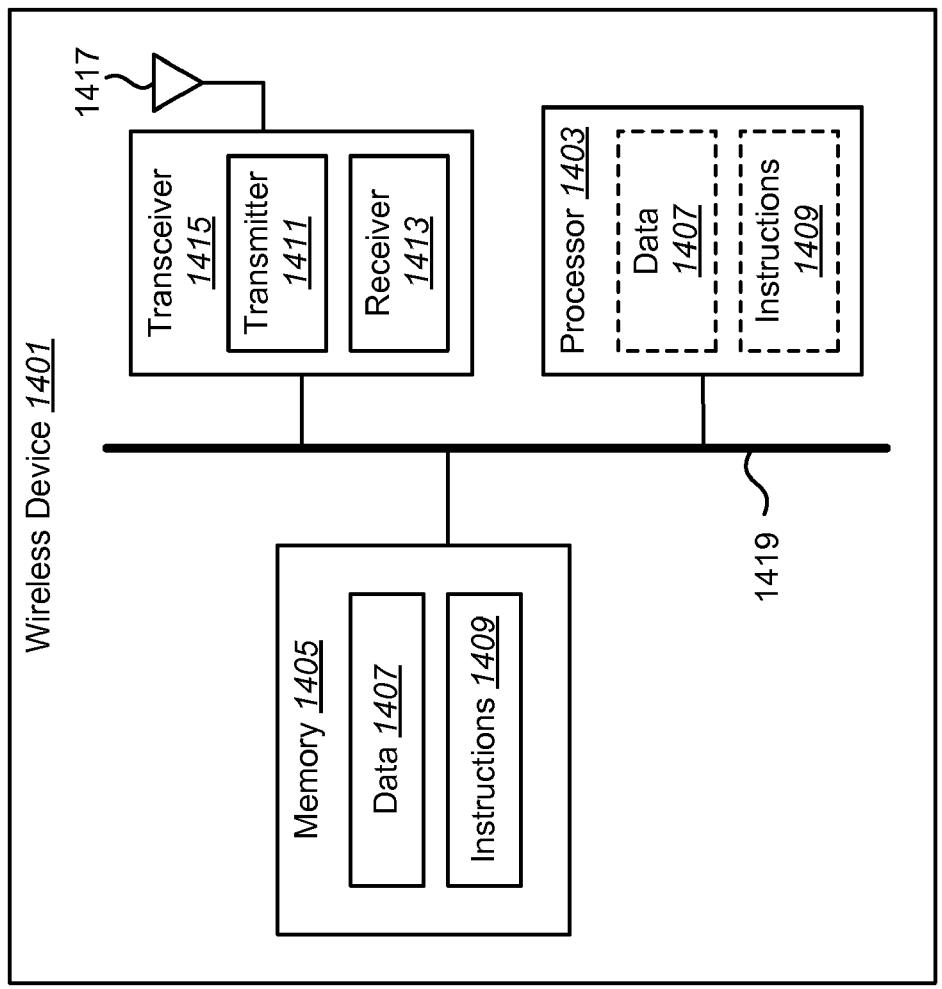
FIG. 14 illustrates certain components that may be included within a wireless device.

FIG. 14 illustrates certain components that may be included within a wireless device 1401. The wireless device 1401 may be a mobile device or a base station. Specifically, the wireless device 1401 may be a mobile device that includes a receiver 100 as illustrated in FIG. 1 and/or a transmitter 200 illustrated in FIG. 2 with a frequency divider with a configurable dividing ratio 942.

The wireless device 1401 includes a processor 1403. The processor 1403 may be a general purpose single- or multi-chip microprocessor (e.g., an ARM), a special purpose microprocessor (e.g., a digital signal processor (DSP)), a microcontroller, a programmable gate array, etc. The processor 1403 may be referred to as a central processing unit (CPU). Although just a single processor 1403 is shown in the wireless device 1401 of FIG. 14, in an alternative configuration, a combination of processors (e.g., an ARM and DSP) could be used.

The wireless device 1401 also includes memory 1405. The memory 1405 may be any electronic component capable of storing electronic information. The memory 1405 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1407 and instructions 1409 may be stored in the memory 1405. The instructions 1409 may be executable by the processor 1403 to implement the methods disclosed herein. Executing the instructions 1409 may involve the use of the data 1407 that is stored in the memory 1405.

The wireless device 1401 may also include a transmitter 1411 and a receiver 1413 to allow transmission and reception of signals between the wireless device 1401 and a remote location. The transmitter 1411 and receiver 1413 may be collectively referred to as a transceiver 1415. An antenna 1417 may be electrically coupled to the transceiver 1415. The wireless device 1401 may also include (not shown) multiple transmitters, multiple receivers, multiple transceivers and/or multiple antenna.

The various components of the wireless device 1401 may be coupled together by one or more buses, which may include a power bus, a control signal bus, a status signal bus, a data bus, etc. For the sake of clarity, the various buses are illustrated in FIG. 14 as a bus system 1419.

In the above description, reference numbers have sometimes been used in connection with various terms. Where a term is used in connection with a reference number, this is meant to refer to a specific element that is shown in one or more of the Figures. Where a term is used without a reference number, this is meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. The term "computer-readable medium" refers to a non-transitory computer-readable medium.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 11, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for dividing a frequency of a signal using a configurable dividing ratio, comprising:
receiving an input signal with a first frequency at clocked switches in a frequency divider with a configurable dividing ratio;
operating non-clocked switches inside the frequency divider to select one of multiple dividing ratios;
coupling each of at least two inverters to a first pair and a second pair of parallel switches, wherein each pair of parallel switches comprises one non-clocked switch in parallel with one of the clocked switches; and
outputting an output signal with a second frequency that is the first frequency divided by the selected dividing ratio.

2. The method of claim 1, wherein the input signal comprises an output signal of a voltage controlled oscillator (VCO).

3. The method of claim 2, wherein the clocked and non-clocked switches comprise metal-oxide-semiconductor field effect transistors (MOSFETs).

4. The method of claim 3, wherein the clocked and non-clocked switches further comprise p-type MOSFETs that couple the inverters to a direct current (DC) reference voltage and n-type MOSFETs that couple the inverters to ground.

5. The method of claim 4, wherein each first pair of parallel switches comprises a clocked p-type MOSFET in parallel with a non-clocked p-type MOSFET, and each second pair of parallel switches comprises a clocked n-type MOSFET in parallel with a non-clocked n-type MOSFET.

6. The method of claim 5, wherein the clocked MOSFETs receive the input signal or an inverted version of the input signal, the non-clocked p-type MOSFETs receive a control signal and the non-clocked n-type MOSFETs receive an inverted version of the control signal.

7. The method of claim 1, wherein the output signal is mixed with a radio frequency signal to produce a baseband signal.

8. The method of claim 1, wherein the output signal is mixed with a baseband signal to produce a radio frequency signal.

9. A frequency divider with a configurable dividing ratio, comprising:
- multiple clocked switches configured to receive an input signal with a first frequency;
- multiple non-clocked switches configured to select one of multiple dividing ratios; and
- multiple inverters configured to output an output signal with a second frequency that is the first frequency divided by the selected dividing ratio, wherein each of at least two inverters is coupled to a first pair and a second pair of parallel switches, wherein each pair of parallel switches comprises one non-clocked switch in parallel with one of the clocked switches.

10. The frequency divider of claim 9, wherein the input signal comprises an output signal of a voltage controlled oscillator (VCO).

11. The frequency divider of claim 10, wherein the clocked and non-clocked switches comprise metal-oxide-semiconductor field effect transistors (MOSFETs).

12. The frequency divider of claim 11, wherein the clocked and non-clocked switches further comprise p-type MOSFETs that couple the inverters to a direct current (DC) reference voltage and n-type MOSFETs that couple the inverters to ground.

13. The frequency divider of claim 12, wherein each first pair of parallel switches comprises a clocked p-type MOSFET in parallel with a non-clocked p-type MOSFET, and each second pair of parallel switches comprises a clocked n-type MOSFET in parallel with a non-clocked n-type MOSFET.

14. The frequency divider of claim 13, wherein the clocked MOSFETs receive the input signal or an inverted version of the input signal, the non-clocked p-type MOSFETs receive a control signal and the non-clocked n-type MOSFETs receive an inverted version of the control signal.

15. The frequency divider of claim 9, wherein the output signal is mixed with a radio frequency signal to produce a baseband signal.

16. The frequency divider of claim 9, wherein the output signal is mixed with a baseband signal to produce a radio frequency signal.

17. A frequency divider for dividing the frequency of a signal using a configurable dividing ratio, comprising:
- means for receiving an input signal with a first frequency at clocked switches in a frequency divider with a configurable dividing ratio;
- means for operating non-clocked switches inside the frequency divider to select one of multiple dividing ratios;
- means for coupling each of at least two inverters to a first pair and a second pair of parallel switches, wherein each pair of parallel switches comprises one non-clocked switch in parallel with one of the clocked switches; and
- means for outputting an output signal with a second frequency that is the first frequency divided by the selected dividing ratio.

18. The frequency divider of claim 17, wherein the input signal comprises an output signal of a voltage controlled oscillator (VCO).

19. The frequency divider of claim 18, wherein the clocked and non-clocked switches comprise metal-oxide-semiconductor field effect transistors (MOSFETs).

20. The frequency divider of claim 19, wherein the clocked and non-clocked switches further comprise p-type MOSFETs that couple the inverters to a direct current (DC) reference voltage and n-type MOSFETs that couple the inverters to ground.

21. The frequency divider of claim 20, wherein each first pair of parallel switches comprises a clocked p-type MOSFET in parallel with a non-clocked p-type MOSFET, and each second pair of parallel switches comprises a clocked n-type MOSFET in parallel with a non-clocked n-type MOSFET.

22. The frequency divider of claim 21, wherein the clocked MOSFETs receive the input signal or an inverted version of the input signal, the non-clocked p-type MOSFETs receive a control signal and the non-clocked n-type MOSFETs receive an inverted version of the control signal.

23. The frequency divider of claim 17, wherein the output signal is mixed with a radio frequency signal to produce a baseband signal.

24. The frequency divider of claim 17, wherein the output signal is mixed with a baseband signal to produce a radio frequency signal.

25. An integrated circuit for dividing a frequency of a signal using a configurable dividing ratio, the integrated circuit being configured to:
- receive an input signal with a first frequency at clocked switches in a frequency divider with a configurable dividing ratio;
- operate non-clocked switches inside the frequency divider to select one of multiple dividing ratios;
- couple each of at least two inverters to a first pair and a second pair of parallel switches, wherein each pair of parallel switches comprises one non-clocked switch in parallel with one of the clocked switches; and
- output an output signal with a second frequency that is the first frequency divided by the selected dividing ratio.

26. The integrated circuit of claim 25, wherein the input signal comprises an output signal of a voltage controlled oscillator (VCO).

27. The integrated circuit of claim 26, wherein the clocked and non-clocked switches comprise metal-oxide-semiconductor field effect transistors (MOSFETs).

28. The integrated circuit of claim 27, wherein the clocked and non-clocked switches further comprise p-type MOSFETs that couple the inverters to a direct current (DC) reference voltage and n-type MOSFETs that couple the inverters to ground.

29. The integrated circuit of claim 28, wherein each first pair of parallel switches comprises a clocked p-type MOSFET in parallel with a non-clocked p-type MOSFET, and each second pair of parallel switches comprises a clocked n-type MOSFET in parallel with a non-clocked n-type MOSFET.

30. The integrated circuit of claim 29, wherein the clocked MOSFETs receive the input signal or an inverted version of the input signal, the non-clocked p-type MOSFETs receive a control signal and the non-clocked n-type MOSFETs receive an inverted version of the control signal.

31. The integrated circuit of claim 25, wherein the output signal is mixed with a radio frequency signal to produce a baseband signal.

32. The integrated circuit of claim 25, wherein the output signal is mixed with a baseband signal to produce a radio frequency signal.

* * * * *